United States Patent [19]

Dey et al.

[11] Patent Number: 5,553,000
[45] Date of Patent: Sep. 3, 1996

[54] ELIMINATING RETIMING BOTTLENECKS TO IMPROVE PERFORMANCE OF SYNCHRONOUS SEQUENTIAL VLSI CIRCUITS

[75] Inventors: Sujit Dey; Miodrag Potkonjak, both of Plainsboro, N.J.; Steven Rothweiler, Kunkletown, Pa.

[73] Assignee: NEC USA, Inc., Princeton, N.J.

[21] Appl. No.: 972,149

[22] Filed: Nov. 5, 1992

[51] Int. Cl.⁶ .............................. G06F 17/50; G06F 1/04
[52] U.S. Cl. .................. 364/488; 364/489; 364/49 D; 364/578; 364/491; 371/22.1; 371/22.3
[58] Field of Search ................... 364/489, 490, 364/491, 488, 578; 307/517, 523; 371/22.1, 22.3; 395/550

[56] References Cited

U.S. PATENT DOCUMENTS

| | | | |
|---|---|---|---|
| 4,263,651 | 4/1981 | Donath et al. | 364/300 |
| 4,630,219 | 12/1986 | DiGiacomo et al. | 364/489 |
| 4,698,760 | 10/1987 | Lembach et al. | 364/490 |
| 4,703,435 | 10/1987 | Darringer et al. | 364/489 |
| 4,924,430 | 5/1990 | Zasio et al. | 364/578 |
| 4,967,386 | 10/1990 | Maeda et al. | 364/578 |
| 5,029,102 | 7/1991 | Drumm et al. | 364/489 |
| 5,095,454 | 3/1992 | Huang | 364/578 |
| 5,150,308 | 9/1992 | Hooper et al. | 364/489 |
| 5,168,455 | 12/1992 | Hooper | 364/490 |
| 5,237,514 | 8/1993 | Curtin | 364/490 |
| 5,282,148 | 1/1994 | Poirot et al. | 364/491 |
| 5,329,188 | 7/1994 | Sikkink et al. | 307/517 |

OTHER PUBLICATIONS

Hitchcock, Sr. et al., "Timing Analysis of Computer Hardware," IBM J. Res. Develop, vol. 26, No. 1, Jan. 1982, pp. 100–105.

K. J. Singh, A. R. Wang, R. K. Brayton, A. S. Vincentelli, "Timing Optimization of Combinational Logic," IEEE 1988, pp. 282–285.

Primary Examiner—Kevin J. Teska
Assistant Examiner—Thai Phan
Attorney, Agent, or Firm—Arthur J. Torsiglieri; Jeffery J. Brosemer

[57] ABSTRACT

A technique for optimizing the speed of sequential synchronous digital circuits. First, the bottlenecks that prevent retiming for shortening the delay period are identified and then conditions to eliminate the bottlenecks are derived. This involves identifying the subcircuits associated with the bottlenecks, satisfying a set of timing constraints on the subcircuits, and developing a new circuit that meets the timing constraints. The new circuit free of bottlenecks can generally be retimed by relocation of the forward slack latches to reduce the clock period.

6 Claims, 5 Drawing Sheets

ELIMINATING RETIMING BOTTLENECKS TO IMPROVE PERFORMANCE OF SYNCHRONOUS SEQUENTIAL VLSI CIRCUITS

FIELD OF INVENTION

This invention relates to the design of integrated circuits and more particularly, to the improvement of performance of sequential synchronous digital circuits by eliminating retiming bottlenecks.

BACKGROUND OF THE INVENTION

The design of large scale integrated circuit by the assembly of functional blocks, logic synthesis, is to a considerable extent now done by computers. Logic synthesis which is a part of computer-aided-design (CAD) largely involves the assembly of logic gates and memory latches to achieve a specific function. While logic synthesis is usually able to deliver area-efficient testable designs, the performance of designs synthesized by simple assembly of logic gates and latches remains a major concern.

For this reason, it is now usual practice to include special provisions for optimizing the basic design. Hitherto, most of the optimization work has been concentrated on combinational circuits, which are circuits consisting solely of logic gates without memory elements such as latches. However, most practical designs are sequential in nature and include memory elements such as latches, and so sequential circuits have also attracted attention for optimization.

One approach to optimization of sequential circuits has been simply to optimize the combinational logic blocks between the latches. However, this approach has limited possibilities, since it does not exploit the sequential nature of the circuit.

Another approach to optimization, or shortening, of the clock period of synchronous sequential circuits involves retiming in which only the sequential elements are considered, the combinational logic being assumed to be fixed. Retiming basically involves the repositioning of latches in the circuit to shorten the path length between selected latches and thereby shorten the path of the affected combinational subcircuits.

However, in the past these and basically similar techniques have not fully exploited the characteristics of sequential synchronous circuits and so have not always achieved the optimum results possible.

An object of this invention is to make retiming techniques more effective to speed up VLSI circuits that include synchronous sequential circuits.

SUMMARY OF THE PRESENT INVENTION

The present invention focuses on improving retiming by first transforming the sequential synchronous circuit to eliminate any bottlenecks that limit retiming to shorten the clock period. Moreover, instead of explicitly identifying and eliminating each retiming bottleneck separately, our solution involves deriving a set of conditions that are to be satisfied by all the paths in the sequential circuit that include a latch, to eliminate the retiming bottlenecks that inhibit retiming.

Our solution consists of identifying retiming bottlenecks, providing sub-circuits, and satisfying a set of timing constraints on the sub-circuits. Satisfying the timing constraints for all the sub-circuits may involve increasing the virtual length or clock period of the resulting circuit. However, the resulting circuit is then retimed to reduce the virtual clock period to one below the original clock period. More specifically, the invention involves a method and apparatus for exploiting the slack at forward slack latches to transform an optimally retimed circuit into a circuit having an equal or higher clock period that can then be retimed to reduce the clock period below the prior original clock period.

In particular, our approach involves doing a timing analysis of all the nodes of the circuit to measure the slack and to identify the input critical nodes, i.e., the inputs that have a slack less than the amount by which the clock period of the circuit is to be reduced. In our preferred embodiment of the invention, there are identified more specifically the input nodes that are retime-critical inputs, a term to be described hereinafter, and the retiree-critical network associated with such retime-critical inputs. Then we identify a set of nodes (v) called cnodes, such that each path in the retiree-critical network has a cnode on it and then extract the cone of each cnode, which is the subcircuit consisting of all combinational paths from v to the primary inputs of the circuits or to the outputs of the latches. We then satisfy the set of conditions mentioned above by satisfying a set of timing constraints for the corresponding cones of the cnodes. Satisfying the set of timing constraints generally involves transforming the circuit. However, the transformed circuit generally can be retimed in conventional fashion to achieve the desired reduction in clock period. Moreover, it will be characteristic of the final retimed circuit that its initial state can be readily computed given the initial state of the original circuit, a feature not generally characteristic of circuits after retiming.

The invention will be better understood from the following more detailed description taken in conjunction with the following drawing.

DETAILED DESCRIPTION OF THE INVENTION

Before describing the invention in detail, it will be helpful to begin by defining a number of the terms and symbols that will be used in the description. As used herein, sequential circuits are circuits that comprise both gates and latches and the latter will be assumed to be edge-triggered.

Any circuit will have both Primary Inputs (PI) and Primary Outputs (PO), the normal inputs and outputs of the circuit. Additionally, the outputs of the latches are considered to be Psuedo-Primary Inputs (PPI) and the inputs to the latches to be pseudo-Primary Outputs (PPO) of the circuit.

A path p from node x to node y is treated as a sequence of nodes and edges starting with x and ending with y. A path is simple if all nodes and all edges on the path, except the first and last node, are distinct. A cycle is a simple path which begins and ends with the same node. Throughout this application, by a path, we refer to a simple path. Each node v has a propagation delay d(v) associated with it. The delay (or, length) of a path p, d(p), is the sum of the propagation delays of the nodes in the path. The weight of a path p, w(p), is the number of latches along path p.

A path p that is free of latches is referred to as a combinational path. A path that includes a latch will be called a sequential path. For a synchronous sequential circuit, the clock period $\phi$ is determined by the length of the longest combinational path in the circuit.

Figure 1:
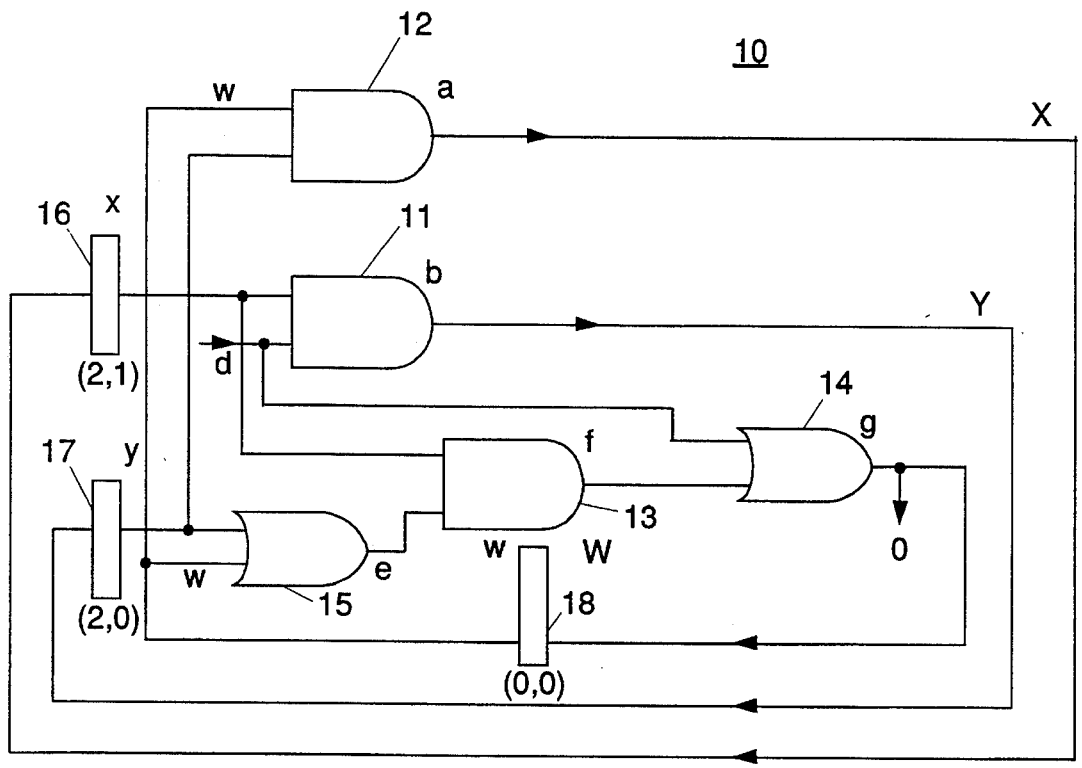
FIG. 1 is a block schematic of an exemplary circuit that is to be redesigned to reduce its clock period in accordance with the principles of the invention.

With reference now to the drawing, FIG. 1 is an example of a sequential synchronous digital circuit 10 that may be redesigned in accordance with the invention to reduce the clock period needed for operation.

It includes AND circuits 11, 12, and 13, OR circuits 14 and 15, and latches 16, 17 and 18.

The Primary Input d is applied both to one input of AND 11 and one input of OR 14. The output b of AND 11 is applied as an input to latch 17 whose output y is applied as an input both to AND 12 and OR 15. The output a of AND 12 supplies an input to latch 16 whose output x is applied as one input both to AND 11 and AND 13. The output f of AND 13 is applied as the other input to OR 14. The output g of OR 14 serves as the Primary Output and also supplies an input to latch 18 whose output w supplies the other input to OR 15 whose output e is another input to AND 13. The output w of latch 18 supplies an input both to AND 12 and OR 15. If each gate is assumed to introduce a unit delay, the sequential circuit will require a clock period of three unit delays and this cannot be reduced either by conventional retiming or restructuring the combinational logic.

With this circuit 10, it is necessary to identify the bottlenecks present that prevent retiming from achieving the desired clock period, which is the difference between the original clock period $\phi$ and the desired reduction $\epsilon$.

A combinational path is termed critical if its length is greater than the clock period desired. A sequential path is termed critical if its length is such that any retiming of the path by moving latches (even illegally) cannot reduce its length to the desired clock period. In particular, if each node is assumed to have unit delay, a sequential path is critical if its length is greater than the product of the desired clock period and one greater than the number of latches in the path. This is based on the assumption that the latches may be moved in the path to shorten the longest path between any two adjacent latches in the path.

Additionally, a cycle, which is a closed path, is deemed critical if any retiming (even illegally) of the cycle cannot reduce its period to the desired clock period. In particular, assuming unit delay at every node, a cycle is critical when the ratio of the length of the cycle divided by the number of latches in the cycle is greater than the desired reduced clock period.

Retiming bottlenecks that limit the use of retiming to reduce the clock period are of three different kinds: a combinational critical path between the primary input and the primary output, a sequential critical path from the primary input to the primary output, and a critical cycle.

There may be a large number of such retiming bottlenecks in a complex circuit and enumerating each bottleneck and eliminating it explicitly may be prohibitive. To this end the invention involves identifying a set of conditions, which, if satisfied eliminates all the retiming bottlenecks, simultaneously in that circuit. These conditions will be discussed later.

For the practice of the invention, one must first know the slack at each of the nodes of the circuit. These can generally be derived by previously known techniques, as for example those described in a paper entitled, "Timing Optimization of Combinational Logic" Proc. IEEE International Conference on Computer-Aided Design, pps 282–285, November 1988. This permits the identification of critical inputs, defined as nodes with slacks less than $\epsilon$, and of retime-critical inputs to be described later.

Knowledge of the slacks at each of the nodes makes it possible to identify and so to satisfy the conditions that need to be met to eliminate all the retiming bottlenecks. The invention is based on taking advantage of the fact that, unlike combinational paths, in a sequential path a latch on a critical path may have a slack greater than the amount of time by which the delay period is to be reduced, where a slack at a node is the difference between the time required that a signal be at the node and the arrival time of the signal at tile node. With each latch node X, one can associate a tuple $(s_i(X)), s_{o1}(X)$ where $s_i(X)$ is the input slack of X and $s_o(X)$ the output slack of X. The tuples associated with the latches 16, 17 and 18 are shown in FIG. 1. A latch is defined as a forward slack latch (FSL) if its input slack $s_i[X]$ is greater than the desired reduction e. Moving a forward slack latch forward increases the length of paths to X but decreases the length of paths from X by the distance moved. A forward slack latch can be moved forward by a distance of $(s_i(X)-\epsilon)$ without making any combinational path to X critical.

Figure 3:
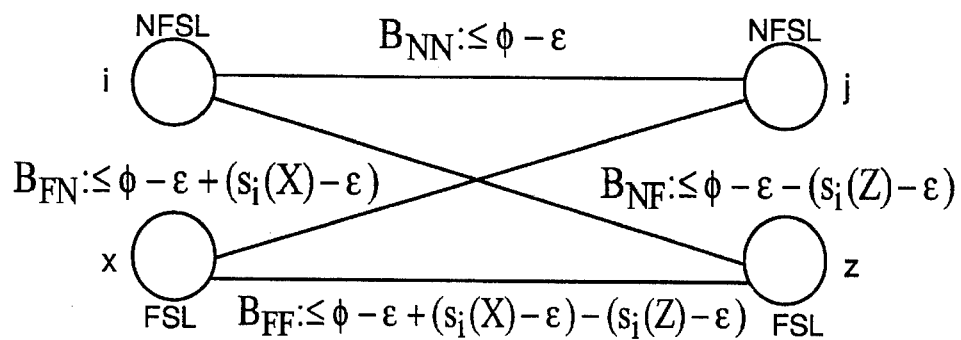
FIG. 3 is a diagram that illustrates the conditions that need to be satisfied if all the retiming bottlenecks in a circuit are to be eliminated.

Similarly, a latch whose output_slack $s_o(X) > \epsilon$ can be moved backward by $(s_o(X)-\epsilon)$, without making any combinational path from X critical. However, to guarantee that the final circuit after retiming has an equivalent initial state, we choose to use only the forward movement of FSLs during retiming. We derive a set of conditions on the paths of the circuit such that satisfying the conditions ensures that the FSLs in the transformed circuit can be moved forward (retimed) to achieve the desired clock period ($\phi-\epsilon$). These conditions are diagrammed in FIG. 3 and will be discussed further below. In circuit 10 shown in FIG. 1, latches X and Y are FSLs, while latch W is a non FLS (NFLS) and the only retiming bottleneck is the initial cycle (WefgLW).

Let the inputs (outputs) of a circuit be partitioned into forward slack latches (FSL) and all other inputs (outputs) which are not forward slack latches (NFSL). If a combinational path beginning with an FSL, X, (whose movement can decrease its length by $(s_i(X)-\epsilon)$) and ending with an FSL, Z, (whose movement may increase its length by $(s_i(Z)-\epsilon)$) has length no greater than $\phi-\epsilon+(s_i(X)-\epsilon)-(s_i(Z)-\epsilon)$, the length of the path can be reduced to ($\phi-\epsilon$) by moving latch X forward during retiming. Similarly, any combinational path beginning with an FSL, X, and ending with an NFSL must have length no greater than $\phi-\epsilon+(s_i(X)-\epsilon)$. Any combinational path beginning with an NFSL and ending with an FSL, Z, must have length no greater than $\phi-\epsilon-(s_i(Z)-\epsilon)$. Finally, combinational paths between NFSLs must have length no greater than $\phi-\epsilon$, because retiming may not be used to reduce these paths. We list below the conditions, applicable to the circuit before retiming. These are set forth in FIG. 3.

$B_{FF}$. All combinational paths pff from any FSL X to any FSL Z have length $d(p_{ff}) \leq \phi - \epsilon + s_i(Z)$.

$B_{FN}$. All combinational paths $p_{fn}$ from any FSL X to any NFSL j have length $d(p_{fn}) \leq \phi + s_i(X) - 2\epsilon$.

$B_{NF}$. All combinational paths $p_{nf}$ from any NFSL i to any FSL Z have length $d(p_{nf}) \leq \phi - s_i(Z)$.

$B_{NN}$. All combinational paths $P_{nn}$ from any NFSL to any NFSL have length $d(p_{nn}) \leq \phi - \epsilon$.

It can be shown that a circuit satisfying these four conditions is free of retiming bottlenecks. Satisfying these conditions by transforming the circuit may increase the clock period of such circuit. However, since such circuit is free of retiming bottlenecks, subsequent retiming will always allow an overall reduction in the clock period to achieve the desired clock period $\phi - \epsilon$. Basically this is accomplished by increasing the lengths of shorter combinational paths and decreasing the lengths of the larger critical combinational paths.

There then remains the problem of transforming the original circuit in order to realize a functionally equivalent circuit that meets all these conditions.

There are a variety of techniques that are available for transforming the original circuit to realize a functionally equivalent circuit that meets all these conditions.

However, it is a feature of our preferred technique that we satisfy the conditions only with respect to all the retime-critical inputs of the circuits. This greatly reduces the computation needed to be performed.

Let a retime-critical input be either a PI j with slack $s(j) \leq \epsilon$ or a PPI X with $s_o(X) < \epsilon$ AND $s_i(X) + s_o(X) < 2\epsilon$. Any critical path from a latch X satisfying $s_i(X) + s_o(X) \geq 2\epsilon$ can be made non-critical during retiming by moving the latch forward. The retime-critical network consists of all nodes with slack less than $\epsilon$ in the transitive fanout of the retime-critical inputs. For the design of the transformed circuit, first we identify a set of nodes {v}, called cnodes, such that each path in the retime-critical network has a cnode on it. We extract the cone of each cnode v, cone(v), which is the sub-circuit comprising of all combinational paths from v to the PI/PPIs. Our approach to satisfy conditions $B_{ff}$ to $B_{nn}$ is to identify the set of cnodes and satisfy a set of timing constraints for the corresponding cones of the cnodes.

For a cnode v, the timing constraints for cone(v) are specified in terms of the arrival times of its inputs (PIs and PPIs), and the required time of its output v. For each input X of cone(v), the new arrival time $$\hat{a}(X) = \begin{cases} 2\epsilon - s_i(X) & \text{if } X \text{ is a forward slack latch (FSL)} \\ \epsilon & \text{otherwise} \end{cases}$$

The new required time for cnode v, $\hat{r}(v)$, is set to be its original required time r(v). If the timing constraints are satisfied, all nodes and edges in cone(v), which are not in the transitive fanin of any other node besides v, are eliminated. The cone for v is now replaced by the new circuit Scone(v), which satisfies the constraints. This operation preserves the functionality of the circuit.

Consider the sequential circuit shown in FIG. 1. The clock period, 3, cannot be reduced by retiming. Let $\epsilon=1$. The retiming bottleneck in the circuit is the critical cycle {W,e, f,g,W}. While the critical inputs of the circuit are y and w, the only retiree-critical input is w.

Figure 2A:
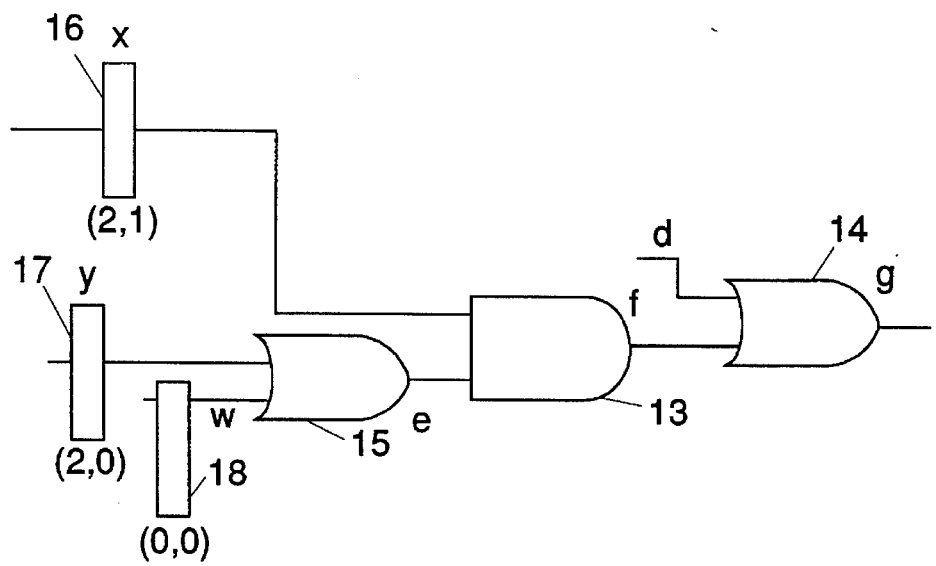
FIG. 2A is the block schematic of the portion of the circuit shown in FIG. 1 that constitutes a retiming bottleneck and needs to be transformed for the practice of the invention.
Figure 2B:
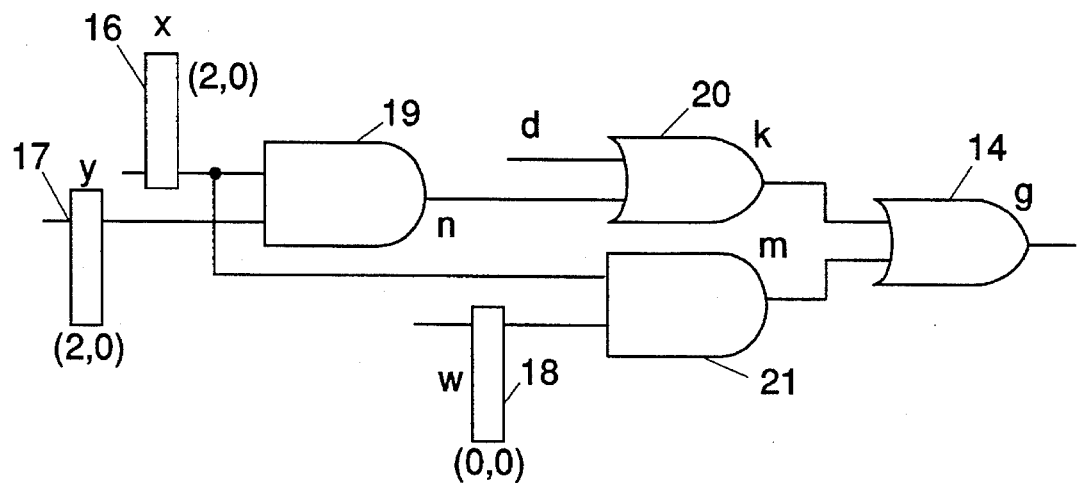
FIG. 2B is the block schematic of the transformed version of the circuit portion of FIG. 2A.

Suppose node 9 is selected as the cnode for the retime-critical input w. Cone(g) is shown in FIG. 2A. As seen, this comprises OR 15, AND 13, OR 14 and latches 16, 17, and 18 and their inputs and outputs interconnected as previously described. The timing constraints that need to be satisfied are: {a(x)=a(y)=0; a(w)=a(d)=1; r(g)=3;} The new cone satisfying the constraints is shown in FIG. 2B. Replacing cone(v) by the new cone produces the transformed circuit shown in FIG. 2C. As seen, this involves replacing AND 13 and OR 15 by AND 19, OR 20 and AND 21 where AND 19 is supplied with inputs x and y and its output n and input d supply OR 1. Its output k and the output m of AND 21 are supplied as inputs to OR 14. AND 21 is supplied with inputs x and w.

Figure 2C:
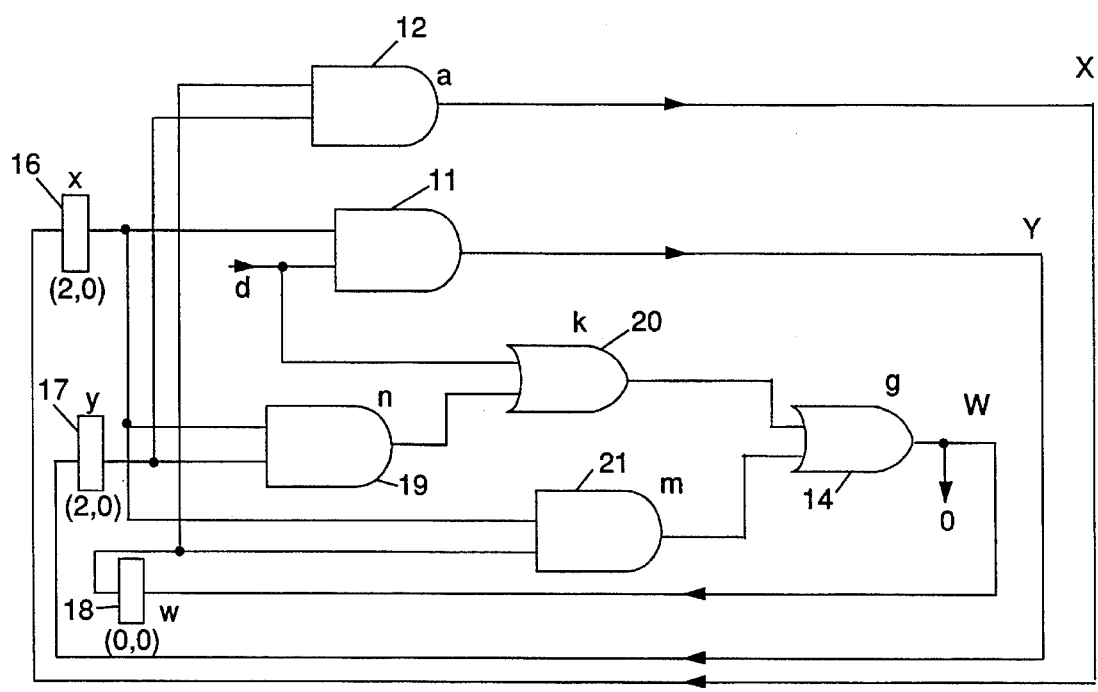
FIG. 2C is the block schematic of the circuit shown in FIG. 1 transformed by the substitution of the circuit portion of FIG. 2B for that of FIG. 2A.
Figure 2D:
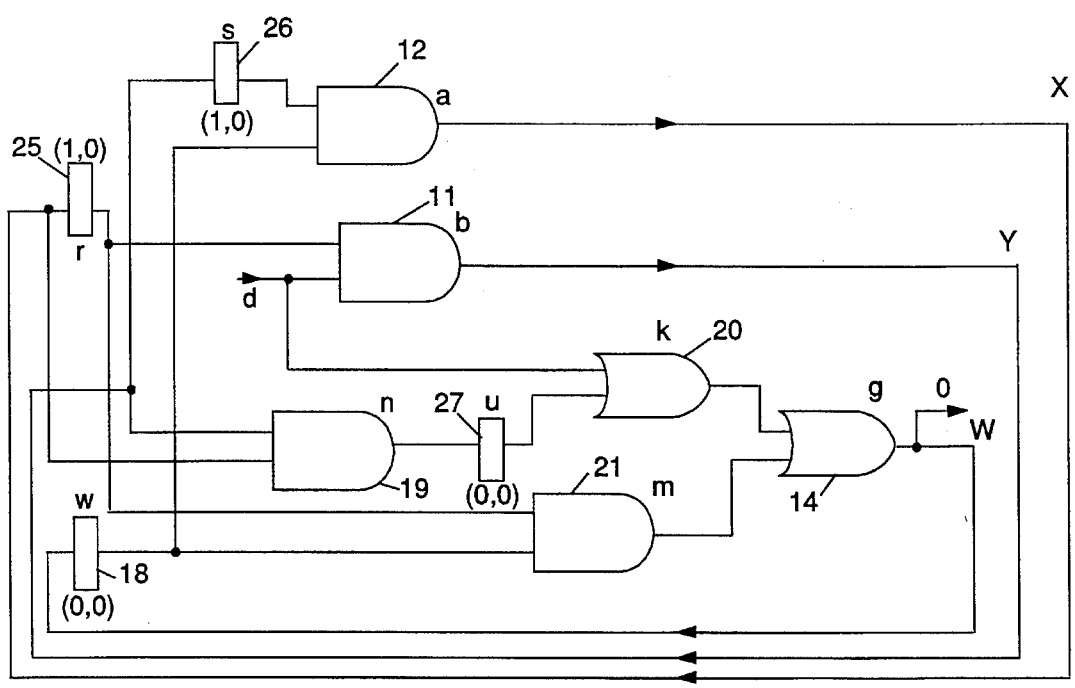
FIG. 2D is the block schematic of the circuit shown in FIG. 2C after it has been retimed to reduce the clock period as desired.

FIG. 2C shows the original circuit shown in FIG. 1 transformed by the substitution of the circuit of FIG. 2B for that of FIG. 2A. Though the clock period of the transformed circuit has not been reduced, the circuit does not contain any retiming bottleneck. Hence, it can be retimed to reduce the clock period by the desired value $\epsilon=1$ to achieve a circuit 30 with the desired clock period of 2, as shown in FIG. 2D. In particular, the retiming involves changes in the position and number of the latches. In particular, latch 16 is replaced with latch 25 which is supplied with the output a of AND 12 and which supplies an input r to AND 11 and AND 21. Latch 16 is moved forward and replicated as latches 25 and 26. Latch 25 supplies inputs to AND 11 and AND 21 and is supplied with an input by AND 12. Latch 26 supplied an input to AND 12 and is supplied by the output of AND 11. Latch 17 is moved forward and becomes latch 27 which is supplied with an input by AND 19 and supplies an input to OR 20. Notice that to improve the delay of the circuit in FIG. 1 by $\epsilon=1$, a combinational delay optimization technique would try to satisfy the conditions {a(x)=a(y)=a(w)=a(d)=0; r(g)= 2;}, and would fail.

In particular, as can be seen from the preceding example, if the timing constraints are satisfied for each cone (v), which is a cutset of the retiree-critical network of the circuit then the conditions listed above $B_{FF}$ to $B_{NN}$ are satisfied. We next address the issue of identifying cnodes such that the timing constraints can be satisfied. Replacing cone(v) by a new cone Scone(v) leads to replication of logic. The two main concerns in the choice of a cnode is the area penalty due to replication of logic and the potential of cone(v) to satisfy its timing constraints.

A heuristic measure of the potential of cone(v) to satisfy its timing constraints is derived from the following observations. (a) Satisfying the constraints consists of making paths from retiree-critical inputs shorter at the expense of making paths from FSLs longer. Hence, the more the number of FSL inputs of a cone as compared to the retiree critical inputs, the larger the potential of satisfying the constraints. (b) If cone(v) is a balanced tree, chances of satisfying the constraints is reduced. Let cone(v) have n inputs. The higher the value of $a(v)/\log_2 n$, the less balanced cone(v) is, and the better the chances of satisfying the constraints. (c) Reconvergence of signals in cone(v) increases the potential of optimizing cone(v). We attempt to find cnodes to with smallest level from the PI/PPIs such that cone(v) has a good potential to satisfy its timing constraints.

We outline now the algorithm ERB to eliminate the retiming bottlenecks by identifying and satisfying timing constraints of cones, and retiming the circuit to produce a final circuit with the desired clock period and an equivalent initial state. For each retiree-critical input i, the function cnodes(i) identifies the cnodes with smallest possible level, such that each critical path from i has a cnode. From the set of cnodes, cnodeSet, for all the retiree-critical inputs, a minimum set of cnodes, min_cnodeSet, is identified by the function cnode_cover, such that min_cnodeSet is a cutset of the retime-critical network. This is the initial set of cnodes.

Cnodes in min_cnodeSet are now processed in a reverse levelized order. For selected cnode v, the cone(v) is extracted. The cone is collapsed into a single node, and a speed-up algorithm such as is described in K.J. Singh, A.R. Wang, R.K. Brayton, and A. Sangiovanni-Vincentelli's 'Timing Optimization of Combinational Logic', in Proc. IEEE International Conference on Computer-Aided Design, pages 282–285, November 1988, is used to satisfy the timing constraints for the cone. If the timing constraints are satisfied, all nodes and edges in cone(v), which are not in the transitive fanin of any other node besides v, are eliminated. The cone for v is now replaced by the new circuit Scone(v). This operation preserves the functionality of the circuit. Cnode v is deleted from min_cnodeSet, and the next cnode with highestt level is selected.

If the timing constraints for cone(v) cannot be satisfied, function cnodes(v) is called to identify a new set of cnodes $C_v$ which covers v. Some nodes of $C_v$ may cover other cnodes present in min_cnodeSet. These cnodes are identified and deleted from min_cnodeSet by the function cnode_cover. Subsequently, each new cnode is processed. The algorithm fails when cnodes(v) fails to find a set of cnodes which covers the node v.

After the timing constraints of all the cones have been satisfied, the new circuit can be retimed to achieve the desired clock period ($\phi$–$\epsilon$). Given the initial state of the original circuit, it may not always be possible to find an equivalent initial state of the final retimed circuit. To circumvent this problem, we to move the latches and simultaneously compute the initial states. Consequently, ERB returns a final circuit with the desired clock period ($\phi$–$\epsilon$), and the new initial state. An outline in pseudo code form of algorithm ERB which has just been described is presented below:

---

Algorithm ERB 1. for each retime-critical input i
2.   if (($C_i$ = cnodes(i)) is empty) return (FALSE);
3.   else cnodeSet = cnodeSet ∪ $C_i$;
4. min_cnodeSet = cnode_cover(cnodeSet);
5. while (min_cnodeSet not empty) {
6.   select cnode v ∈ min_cnodeSet with highest level
7.   if ∃ Scone(v) satisfying timing constraints of cone(v){
8.     remove signals in cone(v) in the transitive fanin of only v;
9.     replace cone(v) by Scone(v);
10.     min_cnodeSet = min_cnodeSet - {v};
    }
  else {
11.     if (($C_v$ = cnodes(v)) is empty) return (FALSE);
    else {
12.       min_cnodeSet = min_cnodeSet ∪ $C_v$;
13.       min_cnodeSet = cnode_cover(min_nodeSet);
    }
  }
}
14. move latches to satisfy desired clock period and compute initial state
15. return (TRUE);

---

Figure 4:
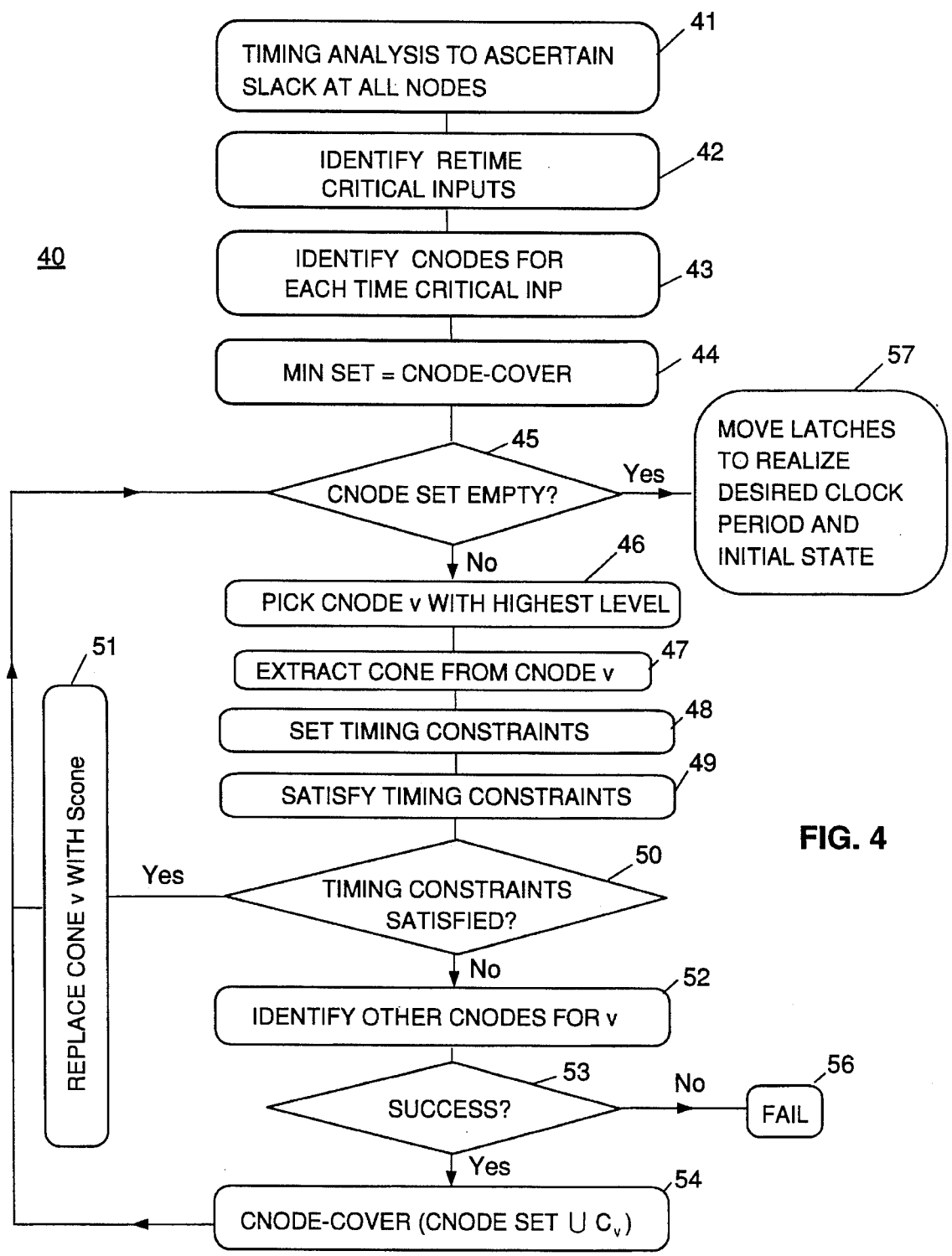
FIG. 4 is a flow chart of the basic steps of the invention.

In FIG. 4, there is set forth a flow chart 40 that depicts in compact fashion the basic steps of the redesign process previously described. Alternatvely, this can be viewed as a block diagram of the components of the apparatus used to do the desired redesign.

As indicated, by block 41 one begins by doing a time analysis of the original circuit in known fashion to establish the slack at each of the input and output primary and pseudo primary nodes.

Next as indicated by block 42, from these and as discussed previously, there can be found first the retime critical inputs and for these there can be found a retime critical network. For each network there can be identified c nodes of the original circuit as indicated by block 43. Next as indicated by block 44, and as discussed with respect to the algorithm ERB, from the set of cnodes, for all the retime-critical inputs, the function cnode-cover identifies a minimum set of cnodes, min-cnodeSet, that is a cutset of the retime critical network.

So long as the cnode set is not empty, as indicated by blocks 45, 46 and 47, there is selected the cnode with the highest level and from it there is extracted its cone. Next there are set and satisfied the timing constraints of the cone as shown by blocks 48 and 49. There is done by collapsing the cone and use of a speed-up algorithm, as known in the art. Once the timing constraints are satisfied, the cone is replaced by the new circuit, Scone, as indicated by block 50 and 51 and the steps 45 through 51 are repeated until the cnode set is empty.

If the timing constraints are not satisfied, for the cone of a cnode, as indicated by block 50, function cnodes (v) is called to identify a new set of cnodes which covers cnode. If one can succeed in finding a new cnode for the cone v, this cnode is added to the outstanding cnodcs remaining that need to be tested and after being added it is compared with cnodes still remaining in the cnode set so that there can be eliminated from the existing set any that the newly added cnode would cover, as indicated by block 54. Then the cnode with the highest level still in the set is processed per block 46 and the procedure repeated.

The process of the invention fails if there remains a node v for which there cannot be found a cnode that provides a cone that meets the timing constraints.

Once the cnode set is empty, indicating that the timing constraints on all the cones have been satisfied, as indicated by block 45, the transformed circuit is formed by substituting all the scones found, and this new circuit is retimed in the usual fashion by moving the latches appropriately to realize the desired reduced clock period and initial state, as indicated by block 57.

It is to be understood that the specific embodiment described in detail is illustrative of the general principles of the invention. Various modifications may be devised without departing from the spirit and scope of the invention. For example, after the conditions for eliminating retiming bottlenecks have been determined, the timing constraints needed at the inputs and outputs of the circuit, transformations of the original circuit satisfying the constraints can be done by other delay optimization techniques as exemplified by the speed-up algorithm earlier mentioned.

What is claimed:

1. A computer-implemented process for redesigning a sequential circuit having both gates and latches, by repositioning the latches in the circuit, the latches dividing the circuit into a plurality of combinational subcircuits comprising the steps of:

doing a timing analysis of the sequential circuit to determine the slack at each of the input and output primary and pseudo primary nodes for determining the input critical nodes of the circuit and from these the retime-critical inputs of the circuit;

establishing a retime-critical network consisting of all nodes with slack less than the amount of time by which the clock period of the circuit is to be reduced in the transitive fanout of the retime-critical inputs;

identify a set of c-nodes such that each path in the retime-critical network has cnode on it;

extracting the cone of each cnode, which is the subcircuit comprising all combinational paths from the cnode to the primary inputs and pseudo primary inputs;

replacing the cone of each cnode with a new subcircuit that satisfies a set of timing constraints and retains the functionality of the subcircuit for proving a transformed circuit; and retiming the transformed circuit by repositioning the latches for realizing a final circuit with reduced clock period.

2. The process of claim 1 in which the step of replacing the cone of each cnode comprises the steps of identifying for each retime-critical input the cnode with the smallest possible level such that each critical path from said retime-critical input has a cnode, from the set of such cnodes, identifying a minimum set such that the minimum set is a cutset of the retime-critical network; and processing the cnodes in the minimum set in a reverse-levelized order until each cnode has been processed for providing an s-cone.

3. The process of claim 1 in which the various steps of identifying and satisfying the timing constraints for eliminating the retiming bottlenecks and providing a transformed circuit and retiming the transformed circuit to realize the final circuit uses the algorithm ERB.

4. Computer apparatus for implementing the process of claim 1.

5. Computer apparatus for implementing the process of claim 2.

6. Computer apparatus for implementing the process of claim 3.

* * * * *